US012813020B2

(12) United States Patent
Song et al.

(10) Patent No.: US 12,813,020 B2
(45) Date of Patent: Nov. 24, 2026

(54) LIGHT-EMITTING DIODE AND SEMICONDUCTOR DEVICE

(71) Applicant: HUAIAN AUCKSUN OPTOELECTRONICS TECHNOLOGY CO., LTD, Huaian (CN)

(72) Inventors: Changwei Song, Huaian (CN); Licheng Huang, Huaian (CN); Yuan Guo, Huaian (CN); Wang Zhan, Huaian (CN); Chih-Ching Cheng, Huaian (CN); Ling Lu, Huaian (CN)

(73) Assignee: HUAIAN AUCKSUN OPTOELECTRONICS TECHNOLOGY CO., LTD, Huaian (CN)

( * ) Notice: Subject to any disclaimer, the term of this patent is extended or adjusted under 35 U.S.C. 154(b) by 676 days.

(21) Appl. No.: 18/207,240

(22) Filed: Jun. 8, 2023

(65) Prior Publication Data

US 2023/0335679 A1 Oct. 19, 2023

Related U.S. Application Data

(63) Continuation-in-part of application No. PCT/CN2021/138505, filed on Dec. 15, 2021.

(30) Foreign Application Priority Data

Jun. 18, 2021 (CN) ........................ 202110680299.X
Jun. 18, 2021 (CN) ........................ 202121371495.0

(51) Int. Cl.

*H10H 20/825* (2025.01)
*H10H 20/81* (2025.01)
(Continued)

(52) U.S. Cl.

CPC ...... *H10H 20/8252* (2025.01); *H10H 20/814* (2025.01); *H10H 20/815* (2025.01);
(Continued)

(58) Field of Classification Search

CPC .. H10H 20/812; H10H 20/814; H10H 20/815; H10H 20/8162; H10H 20/8215;
(Continued)

(56) References Cited

U.S. PATENT DOCUMENTS

2011/0187294 A1* 8/2011 Bergmann ........... H10H 20/811 315/363
2014/0077153 A1* 3/2014 Li ........................ H10H 20/824 257/E33.028
2021/0074875 A1* 3/2021 Li ........................ H10H 20/811

FOREIGN PATENT DOCUMENTS

CN 103972334 A 8/2014
CN 105514237 A 4/2016
(Continued)

OTHER PUBLICATIONS

International Search Report of PCT Patent Application No. PCT/CN2021/138505 issued on Feb. 28, 2022.
(Continued)

*Primary Examiner* — Dmitriy Yemelyanov

(57) ABSTRACT

Provided are a light-emitting diode and a semiconductor device. The light-emitting diode comprises: a substrate; and a buffer layer, an N-type gallium nitride layer, a light-emitting region buffer layer, a first light-emitting layer, a second light-emitting layer, an electron blocking layer, and a P-type gallium nitride layer that are epitaxially grown on the substrate sequentially, wherein: the second light-emitting layer comprises one or more light-emitting well-barrier pair sub-layers; the thickness of the light-emitting region buffer layer is a preset first multiple of the thickness of the light-emitting well-barrier pair sub-layer; the thickness of
(Continued)

the first light-emitting layer is a preset second multiple of the thickness of the light-emitting well-barrier pair sub-layer, the second multiple being less than the first multiple; and the thickness of the electron blocking layer is a preset third multiple of the thickness of the light-emitting well-barrier sub-layer, the third multiple being less than the first multiple.

17 Claims, 3 Drawing Sheets

(51) Int. Cl.

| | |
|---|---|
| ***H10H 20/814*** | (2025.01) |
| ***H10H 20/815*** | (2025.01) |
| ***H10H 20/816*** | (2025.01) |
| ***H10H 20/831*** | (2025.01) |

(52) U.S. Cl.
CPC .... *H10H 20/8162* (2025.01); *H10H 20/8215* (2025.01); *H10H 20/8312* (2025.01)

(58) Field of Classification Search
CPC ............. H10H 20/825; H10H 20/8252; H10H 20/8312
See application file for complete search history.

(56) References Cited

FOREIGN PATENT DOCUMENTS

| | | | |
|---|---|---|---|
| CN | 109346575 | A | 2/2019 |
| CN | 109545925 | A | 3/2019 |
| CN | 109860357 | A | 6/2019 |
| CN | 109980056 | A | 7/2019 |
| CN | 214956918 | U | 11/2021 |

OTHER PUBLICATIONS

Communication pursuant to Article 94(3) EPC of Counterpart European Patent Application No. 21945803.1 issued on Aug. 25, 2025.

First office action of counterpart Chinese Patent Application No. 202110680299.X issued on Jun. 15, 2024.

Second office action of counterpart Chinese Patent Application No. 202110680299.X issued on Jan. 25, 2025.

Notice of Allowance of counterpart Chinese Patent Application No. 202110680299.X issued on Mar. 24, 2025.

* cited by examiner

LIGHT-EMITTING DIODE AND SEMICONDUCTOR DEVICE

CROSS-REFERENCE TO RELATED APPLICATIONS

The present application is a Continuation-In-Part Application of PCT Application No. PCT/CN2021/138505 filed on Dec. 15, 2021, which claims the priority to the Chinese patent application with the filing No. 202110680299.X, filed on Jun. 18, 2021 with the Chinese Patent Office and entitled "Light-emitting Diode and Semiconductor Device" and the Chinese patent application with the filing No. 202121371495.0, filed on Jun. 18, 2021 with the Chinese Patent Office and entitled "Light-emitting Diode and Semiconductor Device", the contents of which are incorporated herein by reference in entirety.

TECHNICAL FIELD

The present disclosure relates to the technical field of semiconductors, in particular to a light-emitting diode (LED) and a semiconductor device.

BACKGROUND ART

The gallium nitride-based LEDs emit light by utilizing the property that visible light is radiated when electrons and holes are recombined, have the characteristics such as energy saving, a long service lifetime, and a small volume, and are extremely widely applied to the illumination field, for example, they can be used for display, indication, decoration, and illumination devices. However, LEDs currently with an epitaxial structure generally have an internal light output power of 50%-80%, which is not high. Especially, the epitaxial structure contains many functional layers, and unreasonable matching between the functional layers affects each other, and in particular, the matching between a light-emitting layer and an electron blocking layer and internal structure of the light-emitting layer cause occurrence of increased non-recombination radiation of a part of carriers, affecting the light output power of the LEDs.

SUMMARY

In view of this, the present disclosure aims at providing a light-emitting diode and a semiconductor device, so as to improve the internal light output power (internal luminous efficiency) of the light-emitting diode.

In a first aspect, an embodiment of the present disclosure provides a light-emitting diode, including:

light-emitting diode, including:

a substrate, and a buffer layer, an N-type gallium nitride layer, a light-emitting region buffer layer, a first light-emitting layer, a second light-emitting layer, an electron blocking layer, and a P-type gallium nitride layer that are epitaxially grown on the substrate in sequence, wherein the second light-emitting layer includes one or more light-emitting well-barrier pair sub-layers;

a thickness of the light-emitting region buffer layer is a pre-set first multiple of a thickness of the light-emitting well-barrier pair sub-layer;

a thickness of the first light-emitting layer is a pre-set second multiple of the thickness of the light-emitting well-barrier pair sub-layer, the second multiple being less than the first multiple; and a thickness of the electron blocking layer is a pre-set third multiple of the thickness of the light-emitting well-barrier pair sub-layer, the third multiple being less than the first multiple.

In combination with the first aspect, in a first possible embodiment of the first aspect of the embodiments of the present disclosure, the thickness of the light-emitting well-barrier pair sub-layer is 90 Å-160 Å, the first multiple is 20-40, the second multiple is 2.5-8, and the third multiple is 1-6.

In combination with the first aspect, in a second possible embodiment of the first aspect of the embodiments of the present disclosure, the thickness of the light-emitting well-barrier pair sub-layer is 110 Å-160 Å, the first multiple is 25-40, the second multiple is 3-8, and the third multiple is 2-6.

In combination with the first possible embodiment of the first aspect, an embodiment of the present disclosure provides a third possible embodiment of the first aspect, wherein the thickness of the light-emitting region buffer layer is 2000 Å-6000 Å, the thickness of the first light-emitting layer is 500 Å-700 Å, and the thickness of the electron blocking layer is 90 Å-960 Å.

In combination with the second possible embodiment of the first aspect, an embodiment of the present disclosure provides a fourth possible embodiment of the first aspect, wherein the thickness of the light-emitting region buffer layer is 2500 Å-6000 Å, the thickness of the first light-emitting layer is 500 Å-700 Å, and the thickness of the electron blocking layer is 110 Å-960 Å.

In combination with the first aspect, an embodiment of the present disclosure provides a fifth possible embodiment of the first aspect, wherein the light-emitting region buffer layer, the first light-emitting layer, and the second light-emitting layer are all n-type doped nitride semiconductors containing Al and In, and wherein an average concentration of Al atoms in the second light-emitting layer is greater than an average concentration of Al atoms in the first light-emitting layer, and the average concentration of Al atoms in the first light-emitting layer is greater than an average concentration of Al atoms in the light-emitting region buffer layer.

In combination with the fifth possible embodiment of the first aspect, an embodiment of the present disclosure provides a sixth possible embodiment of the first aspect, wherein an average concentration of In atoms in the second light-emitting layer is greater than an average concentration of In atoms in the first light-emitting layer, and the average concentration of In atoms in the first light-emitting layer is greater than an average concentration of In atoms in the light-emitting region buffer layer.

In combination with the sixth possible embodiment of the first aspect, an embodiment of the present disclosure provides a seventh possible embodiment of the first aspect, wherein an average concentration of n-type impurity atoms in the light-emitting region buffer layer is greater than an average concentration of n-type impurity atoms in the second light-emitting layer, and the average concentration of n-type impurity atoms in the second light-emitting layer is greater than or equal to an average concentration of n-type impurity atoms in the first light-emitting layer.

In combination with the sixth possible embodiment of the first aspect, an embodiment of the present disclosure provides an eighth possible embodiment of the first aspect, wherein the light-emitting region buffer layer includes one or more sub-layer pairs epitaxially grown in sequence, and the In content in a previous sub-layer pair is less than the In content in a following sub-layer pair in the light-emitting region buffer layer.

In combination with the first aspect, an embodiment of the present disclosure provides a ninth possible embodiment of the first aspect, wherein the second light-emitting layer includes: a first light-emitting well-barrier pair sub-layer and a second light-emitting well-barrier pair sub-layer, the first light-emitting well-barrier pair sub-layer includes: a first light-emitting well sub-layer and a first light-emitting barrier sub-layer, and a second light-emitting well-barrier pair sub-layer includes: a second light-emitting well sub-layer and a second light-emitting barrier sub-layer, and wherein the first light-emitting well sub-layer is epitaxially grown on the first light-emitting layer, the first light-emitting barrier sub-layer is epitaxially grown on the first light-emitting well sub-layer, the second light-emitting well sub-layer is epitaxially grown on the first light-emitting barrier sub-layer, and the second light-emitting barrier sub-layer is epitaxially grown on the second light-emitting well sub-layer.

The light-emitting well-barrier pair sub-layer includes: a light-emitting well sub-layer and a barrier sub-layer, wherein the barrier sub-layer is epitaxially grown on the light-emitting well sub-layer, and the second light-emitting layer is of a periodic structure formed by alternately laminating light-emitting well sub-layers and barrier sub-layers.

In one or more embodiments, the n-type impurity is silicon, and in the N-type gallium nitride layer, a molar concentration of silicon atoms is $10^{18}/cm^3$-$10^{21}/cm^3$, a molar concentration of silicon atoms in the light-emitting region buffer layer is $10^{18}/cm^3$-$10^{19}/cm^3$, a molar concentration of silicon atoms in the second light-emitting layer is $10^{17}/cm^3$-$10^{18}/cm^3$, and a molar concentration of silicon atoms in the first light-emitting layer is $10^{17}/cm^3$-$10^{19}/cm^3$.

In one or more embodiments, the light-emitting well-barrier pair sub-layer includes: a light-emitting well sub-layer and a barrier sub-layer, wherein the barrier sub-layer is epitaxially grown on the light-emitting well sub-layer, the second light-emitting layer is of a periodic structure in which the light-emitting well sub-layers and the barrier sub-layers are alternately laminated, and the number of cycles of the periodic structure is 3-15.

In a second aspect, an embodiment of the present disclosure further provides a semiconductor device, including the above light-emitting diode.

For the light-emitting diode and the semiconductor device provided in the embodiments of the present disclosure, the light-emitting diode includes: the substrate, and the buffer layer, the N-type gallium nitride layer, the light-emitting region buffer layer, the first light-emitting layer, the second light-emitting layer, the electron blocking layer, and the P-type gallium nitride layer that are epitaxially grown on the substrate in sequence, wherein the second light-emitting layer includes one or more light-emitting well-barrier pair sub-layers; the thickness of the light-emitting region buffer layer is a pre-set first multiple of the thickness of the light-emitting well-barrier pair sub-layer; the thickness of the first light-emitting layer is a pre-set second multiple of the thickness of the light-emitting well-barrier pair sub-layer, the second multiple being less than the first multiple; and the thickness of the electron blocking layer is a pre-set third multiple of the thickness of the light-emitting well-barrier pair sub-layer, the third multiple being less than the first multiple.

Meanwhile, the concentration relationships between the Al atoms, n-type impurities, and In atoms in the light-emitting region buffer layer, the first light-emitting layer, and the second light-emitting layer are adjusted. In this way, by optimizing the optimal matching thickness of various layers from the buffer layer to the P-type GaN layer, and associating the thickness of the light-emitting region buffer layer, the first light-emitting layer, and the electron blocking layer with the second light-emitting layer, the matching performance between various layers that affects each other is optimized, so that the internal light output power of the light-emitting diode can be effectively improved.

In order to make the above objectives, features, and advantages of the present disclosure more obvious and understandable, preferable embodiments are particularly illustrated below to give detailed descriptions in conjunction with the drawings.

BRIEF DESCRIPTION OF DRAWINGS

In order to more clearly illustrate the technical solutions of embodiments of the present disclosure, drawings which need to be used in the embodiments will be introduced below briefly. It should be understood that the drawings below merely show some embodiments of the present disclosure, and therefore should not be considered as limitation to the scope. Those ordinarily skilled in the art still could obtain other relevant drawings according to these drawings, without using any creative efforts.

DETAILED DESCRIPTION OF EMBODIMENTS

Figure 1:
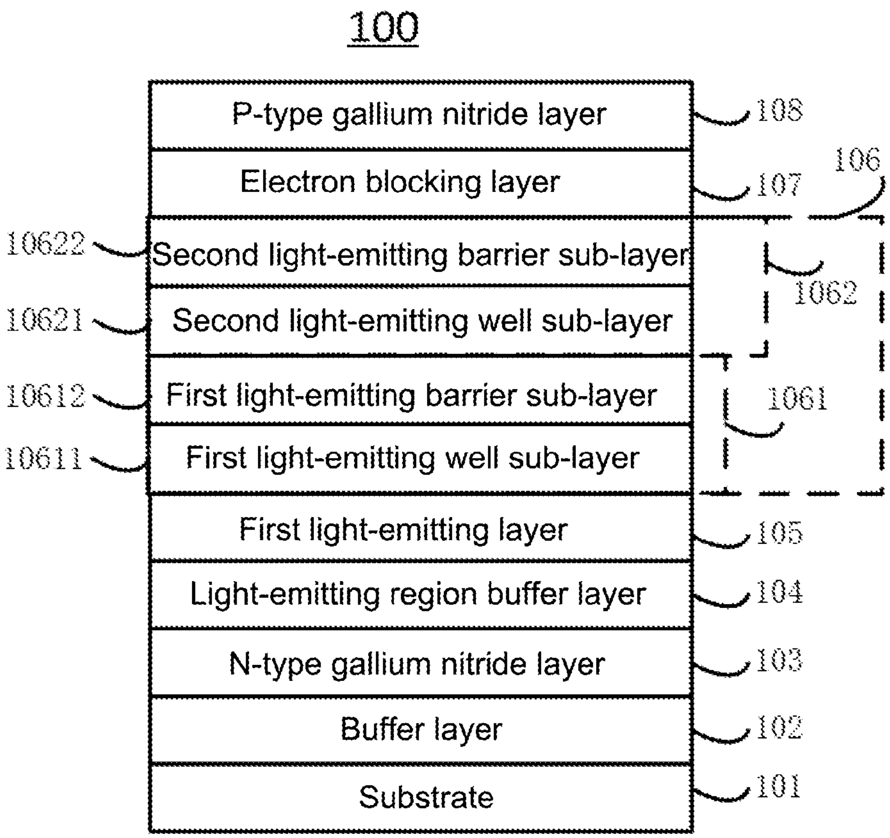
FIG. 1 shows a structural schematic diagram of a light-emitting diode provided in an embodiment of the present disclosure.

In order to make objectives, technical solutions, and advantages of the embodiments of the present disclosure clearer, the technical solutions in the embodiments of the present disclosure will be described clearly and completely below in conjunction with the drawings in the embodiments of the present disclosure. Apparently, the described embodiments are only some but not all of embodiments of the present disclosure. Generally, components in the embodiments of the present disclosure described and shown in the drawings herein may be arranged and designed in different configurations. Therefore, the detailed description below of the embodiments of the present disclosure provided in the drawings is not intended to limit the scope of protection of the present disclosure, but merely represents chosen embodiments of the present disclosure. Based on the embodiments of the present disclosure, all of other embodiments obtained by a person skilled in the art without using any creative efforts shall fall within the scope of protection of the present disclosure.

For existing LEDs, as a material of a light-emitting layer in an epitaxial structure is generally gallium nitride, n-type electrons have a relatively high concentration and a relatively large mobility. While in a P-type gallium nitride layer above the light-emitting layer, holes have a relatively small carrier concentration and a relatively low mobility, so that the electrons often overflow into the P-type gallium nitride layer, and a part of the carriers generated by the P-type gallium nitride layer have nonradiative recombination with the electrons, thus reducing internal light output power. In addition, as various layers of the epitaxial structure are made of different materials, corresponding lattice constants are different, stress is generated due to mismatching of the lattice constants, and polarization field intensity caused by the stress also reduces the internal light output power of the LEDs. In embodiments of the present disclosure, with regard to the fact that the epitaxial structure contains more layers and various layers affect and restrict each other, under the condition of fully considering mutual influence between various layers, the internal light output power of the LEDs is improved by optimizing the thickness of layers of the epitaxial structure reducing the probability of nonradiative recombination of the carriers and the electrons, and optimizing materials of layers to reduce the influence of stress generated by mismatching of lattice constants of layers on the internal light output power.

Embodiments of the present disclosure provide a light-emitting diode and a semiconductor device, which are described below with embodiments.

FIG. 1 shows a structural schematic diagram of a light-emitting diode provided in an embodiment of the present disclosure. As shown in FIG. 1, the light-emitting diode 100 includes:

- a substrate 101, and a buffer layer 102, an N-type gallium nitride (GaN) layer 103, a light-emitting region buffer layer 104, a first light-emitting layer 105, a second light-emitting layer 106, an electron blocking layer 107, and a P-type gallium nitride layer 108 that are epitaxially grown on the substrate 101 in sequence, wherein
- the second light-emitting layer 106 includes one or more light-emitting well-barrier pair sub-layers;
- a thickness of the light-emitting region buffer layer 104 is a pre-set first multiple of a thickness of the light-emitting well-barrier pair sub-layer;
- a thickness of the first light-emitting layer 105 is a pre-set second multiple of the thickness of the light-emitting well-barrier pair sub-layer, the second multiple being less than the first multiple; and
- a thickness of the electron blocking layer 107 is a pre-set third multiple of the thickness of the light-emitting well-barrier pair sub-layer, the third multiple being less than the first multiple.

In the embodiments of the present disclosure, as an optional embodiment, the first light-emitting layer 105 and the second light-emitting layer 106 are same in structure, each including one or more light-emitting well-barrier pair sub-layers, and difference lies in that some components in a material of the light-emitting well-barrier pair sub-layers have different contents.

In the embodiments of the present disclosure, as an optional embodiment, the light-emitting well-barrier pair sub-layer includes: a light-emitting well sub-layer and a barrier sub-layer, wherein the barrier sub-layer is epitaxially grown on the light-emitting well sub-layer, and the second light-emitting layer is of a periodic structure in which light-emitting well sub-layers and barrier sub-layers are alternately laminated. As an optional embodiment, the number of cycles is 3-15.

In the embodiments of the present disclosure, as an optional embodiment, two light-emitting well-barrier pair sub-layers are provided, and the second light-emitting layer 106 includes: a first light-emitting well-barrier pair sub-layer 1061 and a second light-emitting well-barrier pair sub-layer 1062, wherein the first light-emitting well-barrier pair sub-layer 1061 includes: a first light-emitting well sub-layer 10611 and a first light-emitting barrier sub-layer 10612; and a second light-emitting well-barrier pair sub-layer 1062 includes: a second light-emitting well sub-layer 10621 and a second light-emitting barrier sub-layer 10622,

- wherein, the first light-emitting well sub-layer 10611 is epitaxially grown on the first light-emitting layer 105, the first light-emitting barrier sub-layer 10612 is epitaxially grown on the first light-emitting well sub-layer 10611, the second light-emitting well sub-layer 10621 is epitaxially grown on the first light-emitting barrier sub-layer 10612, and the second light-emitting barrier sub-layer 10622 is epitaxially grown on the second light-emitting well sub-layer 10621.

In the embodiments of the present disclosure, for the case where the second light-emitting layer 106 includes more light-emitting well-barrier pair sub-layers, the light-emitting well-barrier pair sub-layers are epitaxially grown in sequence.

In the embodiments of the present disclosure, as an optional embodiment, the material of the N-type GaN layer is GaN, the material of the light-emitting well sub-layer is InGaN, the material of the barrier sub-layer is GaN, the light-emitting region buffer layer includes one or more sub-layer pairs epitaxially grown in sequence, and each sub-layer pair includes: a GaN sub-layer and an InGaN sub-layer, wherein the material of the GaN sub-layer is GaN, the material of the InGaN sub-layer is InGaN, and an In content of the light-emitting region buffer layer is smaller than that of the light-emitting well sub-layer of the first light-emitting layer. In this way, the light-emitting region buffer layer is used as a transition layer between the N-type GaN layer and the light-emitting well sub-layer of the first light-emitting layer, and as the In content in the light-emitting region buffer layer is smaller than that of the light-emitting well sub-layer of the first light-emitting layer, lattice mutation (stress) caused by different materials (different lattice constants) of the N-type GaN layer and the light-emitting well sub-layer in the first light-emitting layer can be effectively relieved, and the stress generated by the mismatching of the lattice constants of the N-type GaN layer and the first light-emitting layer can be released, thus reducing the influence of polarization field intensity on the light output power caused by the stress.

In the embodiments of the present disclosure, as an optional embodiment, the thickness of the light-emitting well-barrier pair sub-layer is set to 90 Å-160 Å, the first multiple is 20-40, the second multiple is 2.5-8, and the third multiple is 1-6. As another more preferred optional embodiment, the thickness of the light-emitting well-barrier pair sub-layer is set to 110 Å-160 Å, which is capable of optimizing the radiation recombination efficiency, the first multiple is 25-40, the second multiple is 3-8, and the third multiple is 2-6.

In the embodiments of the present disclosure, as an optional embodiment, the thickness of the light-emitting region buffer layer 104 is 2000 Å-6000 Å, and in this thickness range, the stress generated by the mismatching of the lattice constants of the N-type GaN layer and the light-emitting well sub-layer in the first light-emitting layer can be released to the greatest degree, and defects generated at an interface between the N-type GaN layer and the light-emitting region buffer layer are prevented from continuing to grow. If the thickness of the light-emitting region buffer layer 104 is less than this thickness range, the stress will be released insufficiently; and if the thickness exceeds this thickness range, an emission angle of light will be changed, affecting the light output power of the LED.

In the embodiments of the present disclosure, as an optional embodiment, if the thickness of the light-emitting region buffer layer 104 is 2000 Å-6000 Å, the thickness of the first light-emitting layer 105 is set to 500 Å-700 Å, and the thickness of the electron blocking layer 107 is set to 90 Å-960 Å. As a more preferred optional embodiment; and if the thickness of the light-emitting region buffer layer 104 is 2500 Å-6000 Å, the thickness of the first light-emitting layer 105 is set to 500 Å-700 Å, and the thickness of the electron blocking layer 107 is set to 110 Å-960 Å.

In the embodiments of the present disclosure, as an optional embodiment, the light-emitting region buffer layer, the first light-emitting layer, and the second light-emitting layer are all n-type doped nitride semiconductors containing Al and In, wherein an average concentration of Al atoms in the second light-emitting layer is greater than an average concentration of Al atoms in the first light-emitting layer, and the average concentration of Al atoms in the first light-emitting layer is greater than an average concentration of Al atoms in the light-emitting region buffer layer.

In the embodiments of the present disclosure, as an optional embodiment, an average concentration of In atoms in the second light-emitting layer is greater than an average concentration of In atoms in the first light-emitting layer, and the average concentration of In atoms in the first light-emitting layer is greater than an average concentration of In atoms in the light-emitting region buffer layer. As another optional embodiment, an average concentration of n-type impurity atoms in the light-emitting region buffer layer is greater than an average concentration of n-type impurity atoms in the second light-emitting layer, and the average concentration of n-type impurity atoms in the second light-emitting layer is greater than or equal to an average concentration of n-type impurity atoms in the first light-emitting layer.

In the embodiments of the present disclosure, the light-emitting region buffer layer, the first light-emitting layer, and the second light-emitting layer all contain a certain amount of In, so that crystal quality is not high, and defects generated from underlying layers (the substrate, the buffer layer, and the N-type GaN layer) possibly cannot be covered in these layers, instead, they will be continuously amplified and increased. Therefore, in order to improve the performance, as an optional embodiment, the material of the electron blocking layer is dopant-containing GaN, wherein the dopant is one of Si, Mg, In, and Al or any combination thereof. In this way, a forbidden band width of the electron blocking layer can be increased, the blocking effect on the electrons can be improved, and a better long crystal quality of GaN of the electron blocking layer is used to achieve the effect of filling the defects, wherein the thicker the thickness is, the better the filling effect is; however, on the other hand, as the electron blocking layer contains dopant components such as Al, the higher the energy barrier thereof is, the larger the thickness is, the more obvious the energy barrier effect is, the stronger the blocking to the holes is, so that fewer holes enter the second light-emitting layer, and the radiative recombination efficiency is decreased. Thus, as an optional embodiment, the third multiple is 1-6, wherein within this thickness range, an epitaxial wafer can have both a good surface and a relatively good energy barrier effect; if the thickness is less than this thickness range, insufficient coverage of defects derived from underlying layers (layers below the electron blocking layer) and an insufficient control over electron overflow result in poor radiative recombination efficiency; and if this thickness is exceeded, absorption of photons and blocking of holes are caused by the light absorption phenomenon and too strong energy barrier effect, thus affecting the radiative recombination efficiency.

Generally, the electron blocking layer is a GaN layer doped with Al and Mg, where the molar concentration of Al atoms is not less than $1\times10^{21}/cm^3$.

In the embodiments of the present disclosure, the buffer layer is made of GaN or AlGaN.

In the embodiments of the present disclosure, the n-type impurity is silicon, and as an optional embodiment, in the N-type GaN layer, silicon (Si) doping is performed in the GaN, and molar concentration of the doped Si atoms is $1\times10^{18}/cm^3$-$1\times10^{21}/cm^3$, preferably $1\times10^{19}/cm^3$-$1\times10^{21}/cm^3$, where the Si doping concentration in the N-type GaN layer is higher than that in other layers.

In the embodiments of the present disclosure, the light-emitting region buffer layer may contain one or more sub-layer pairs epitaxially grown in sequence, wherein the In content of the InGaN sub-layer in a sub-layer pair is less than the In content of the InGaN sub-layer in a following sub-layer pair thereof. As an optional embodiment, the InGaN used in the light-emitting region buffer layer may contain GaN and InGaN of a superlattice structure, and also may contain a dopant, wherein the dopant is one of Al and Si or any combination thereof, and a molar concentration of silicon atoms in the light-emitting region buffer layer is $1\times10^{18}/cm^3$-$1\times10^{19}/cm^3$. In practice, the part of the light-emitting region buffer layer near the first light-emitting layer is an alternately laminated structure of InGa light-emitting well layer and GaN barrier layer, and the part of the light-emitting region buffer layer near the N-type GaN layer is also a Si doped GaN layer (compared to InGaN well layer, it can also be used as a barrier layer).

In the embodiments of the present disclosure, as an optional embodiment, the material of the first light-emitting layer may contain a superlattice structure, and Al and/or Si doping may also be performed in the material, wherein the molar concentration of Si atoms is $1\times10^{17}/cm^3$-$1\times10^{19}/cm^3$. In an embodiment, the first light-emitting layer is of a periodic structure in which the InGaN light-emitting well sub-layers and the GaN barrier sub-layers are alternately laminated, and the number of cycles thereof is 3-8, generally 5, where the GaN barrier sub-layers contain Si doped impurities.

In the embodiments of the present disclosure, as an optional embodiment, in the material of the second light-emitting layer, Al and/or Si doping is performed, wherein the molar concentration of silicon atoms in the second light-emitting layer is $1\times10^{17}/cm^3$-$1\times10^{18}/cm^3$. In an embodiment, the second light-emitting layer is of a periodic structure in which the InGaN light-emitting well sub-layers and the AlGaN barrier sub-layers are alternately laminated, and the number of cycles thereof is 3-15, generally 10, where the AlGaN barrier sub-layers contain Si doped impurities.

In an embodiment of the present disclosure, the electron blocking layer may contain one or more sub-layers.

In the embodiments of the present disclosure, the P-type GaN layer is made of GaN, and Mg and/or Si may be doped in the GaN.

In the embodiments of the present disclosure, by optimizing an optimal matching thickness of various layers from the buffer layer to the P-type GaN layer, the thickness of the light-emitting region buffer layer, the first light-emitting layer, and the electron blocking layer are all associated with the second light-emitting layer, thus optimizing the matching performance between various layers that affects each other, reducing stress mismatching generated due to thickness mismatching between various layers of the epitaxial structure, reducing carrier nonradiative recombination induced by stress mismatch, and improving the radiative recombination efficiency; and meanwhile, by optimizing materials of various layers of the epitaxial structure, the influence of the stress generated by the mismatching of the lattice constants of various layers on the internal light output power is reduced, thus improving the internal light output power.

Figure 2:
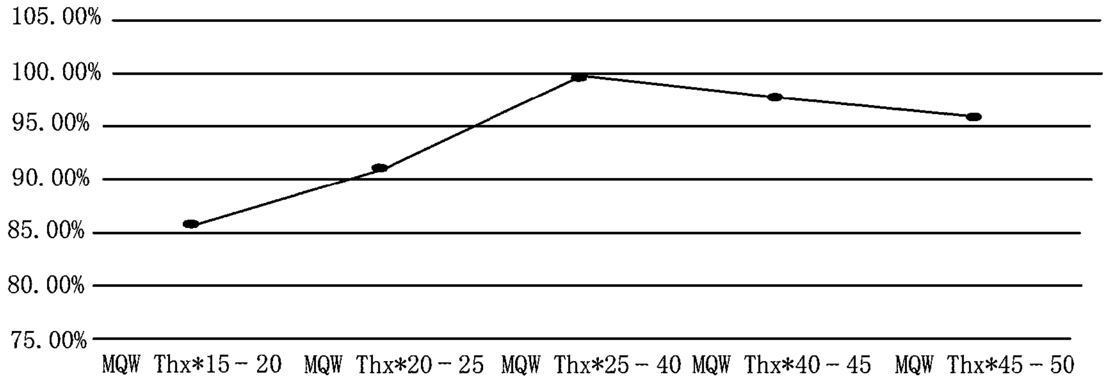
FIG. 2 shows a schematic diagram of relationship of light output power corresponding to light-emitting region buffer layers of different thickness, based on thickness of a light-emitting well-barrier pair sub-layer, in the light-emitting diode provided in the embodiment of the present disclosure.

FIG. 2 shows a schematic diagram of relationship of light output power corresponding to light-emitting region buffer layers of different thickness, based on thickness of a light-emitting well-barrier pair sub-layer, in the light-emitting diode provided in the embodiment of the present disclosure. As shown in FIG. 2, in the drawing, the thickness of the light-emitting well-barrier pair sub-layer is MQW Thx, wherein MQW Thx*15-20 means that the thickness of the light-emitting region buffer layer is 15-20 times the thickness of the light-emitting well-barrier pair sub-layer; and by adjusting the thickness of the light-emitting region buffer layer to MQW Thx*15-50, the light output power (LOP) can be maintained above 85%, and especially when the thickness of the light-emitting region buffer layer is MQW Thx*25-40, LOP is close to 100%.

Figure 3:
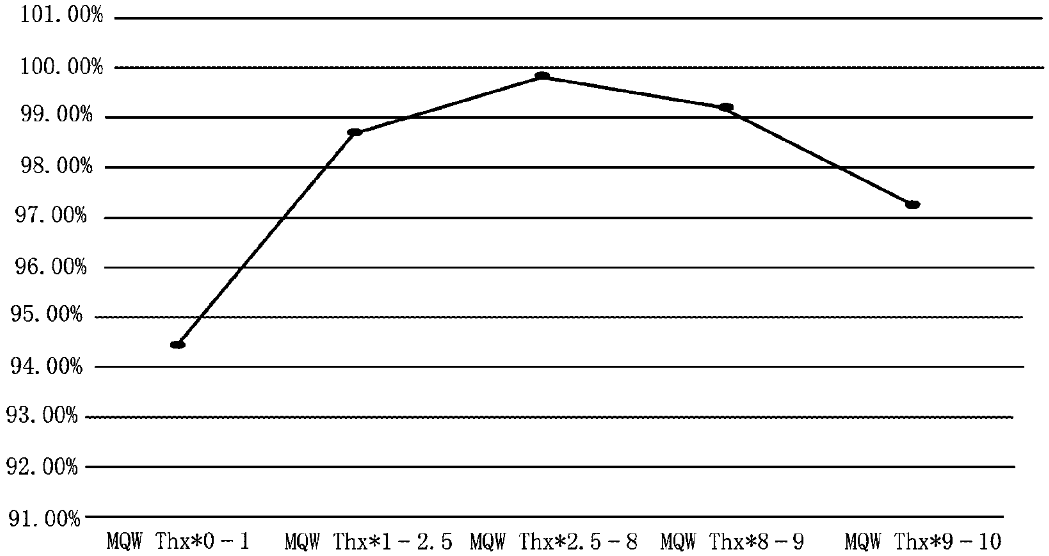
FIG. 3 shows a schematic diagram of relationship of light output power corresponding to second light-emitting layers of different thickness, based on the thickness of the light-emitting well-barrier pair sub-layer, in the light-emitting diode provided in the embodiment of the present disclosure.

FIG. 3 shows a schematic diagram of relationship of light output power corresponding to second light-emitting layers of different thickness, based on the thickness of the light-emitting well-barrier pair sub-layer, in the light-emitting diode provided in the embodiment of the present disclosure. As shown in FIG. 3, in the drawing, all the LOPs are higher than 94%, especially when the thickness of the second light-emitting layer is MQW Thx*2.5-8, the LOP is close to 100%.

Figure 4:
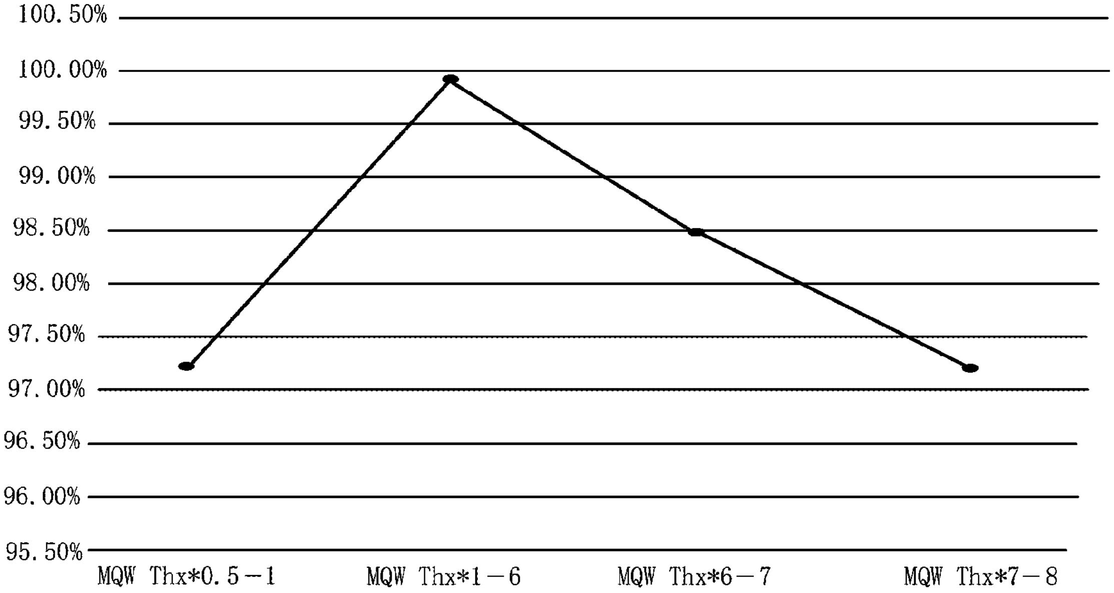
FIG. 4 shows a schematic diagram of relationship of light output power corresponding to electron blocking layers of different thickness, based on thickness of the light-emitting well-barrier pair sub-layer, in the light-emitting diode provided in the embodiment of the present disclosure.

FIG. 4 shows a schematic diagram of relationship of light output power corresponding to electron blocking layers of different thickness, based on thickness of the light-emitting well-barrier pair sub-layer, in the light-emitting diode provided in the embodiment of the present disclosure. As shown in FIG. 4, in the drawing, all the LOPs are higher than 97%, especially when the thickness of the electron blocking layer is MQW Thx*1-6, the LOP is close to 100%.

Figure 5:
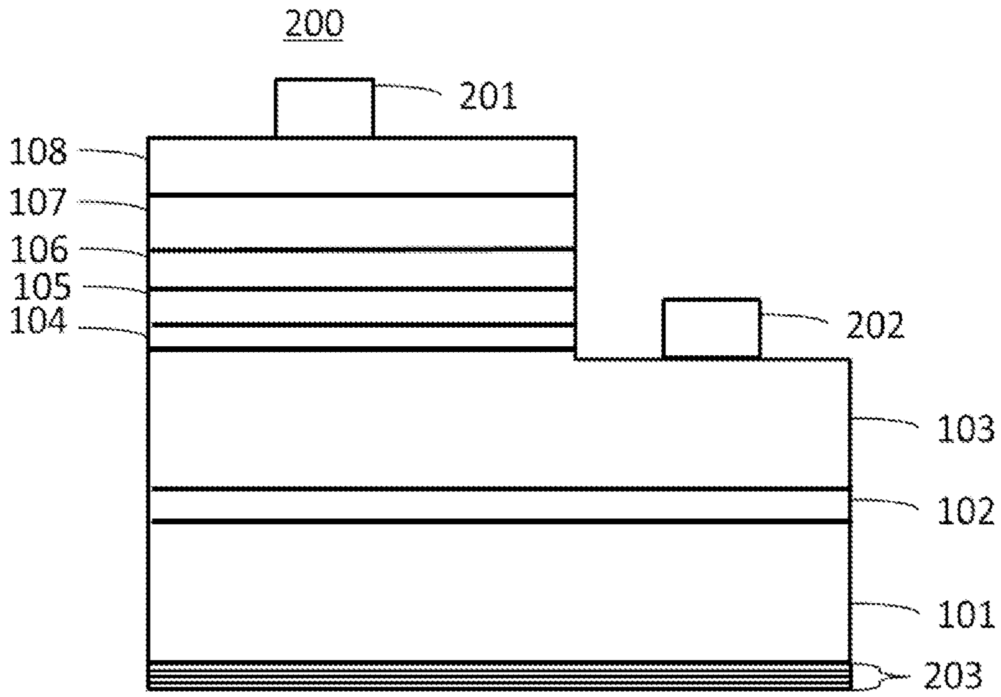
FIG. 5 shows a structural schematic diagram of a semiconductor device provided in an embodiment of the present disclosure.

The present disclosure further provides a semiconductor device 200, which includes a light-emitting diode 100 formed by applying the above embodiments. In an embodiment, with reference to FIG. 5, the semiconductor device 200 is of a front-mounted LED structure, which includes a P electrode 201 disposed on and electrically connected to the P-type gallium nitride layer 108, and an N electrode 202 disposed on and electrically connected to the N-type gallium nitride layer.

When the P electrode 201 and the N electrode 202 are connected to an external power supply, electrons generated in the N-type gallium nitride layer 103 will diffuse towards a positive direction into the light-emitting layers (105, 106), and holes in the P-type gallium nitride layer 108 will diffuse towards a negative direction into the light-emitting layers (105, 106). The electrons and the holes entering the light-emitting layers (105, 106) are closed in the light-emitting layers (105, 106) due to the effect of a heterojunction barrier layer. When the electrons are recombined with the holes through transition, spontaneous emission light is generated.

In one or more embodiments, in order to increase an amount of light emission from a front side of the semiconductor device 200, a reflective layer 203 is generally provided on a back side of the substrate 101, and the reflective layer is a distributed Bragg reflective layer or a metal reflective layer with high reflectivity.

In another embodiment, the light-emitting diode 100 further may be formed into a semiconductor device 200 of other structures, for example, LED of an inverted structure or LED of a high-voltage structure or LED of a vertical structure or an illumination device including the above light-emitting diode 100, through an etching process, an evaporation process, and a grinding process, etc.

It should be noted that similar numerals and letters refer to similar items in the following drawings, therefore, once a certain item is defined in one drawing, no further definition and explanation are required in subsequent drawings. Besides, the terms "first", "second", "third", etc. are only used to distinguish the description and should not be construed as indicating or implying importance in relativity.

Finally, it should be indicated that the above embodiments are merely specific embodiments of the present disclosure, for illustrating the technical solutions of the present disclosure, rather than limiting the present disclosure. The scope of protection of the present disclosure should not be limited thereto. While the detailed description is made to the present disclosure with reference to the above-mentioned embodiments, those ordinarily skilled in the art should understand that the technical solutions recited in the above-mentioned embodiments still can be modified, or readily changed, or equivalent substitutions can be made to some of the technical features therein within the technical scope disclosed in the present disclosure; and these modifications, changes, or substitutions do not make the corresponding technical solutions essentially depart from the spirit and scope of the technical solutions of the embodiments of the present disclosure. They all should be covered within the scope of protection of the present disclosure. Therefore, the scope of protection of the present disclosure should be based on the scope of protection of the claims.

INDUSTRIAL APPLICABILITY

To sum up, the present disclosure provides a light-emitting diode and a semiconductor device. In the present disclosure, the internal light output power of the LED is improved by optimizing the thickness of layers of the epitaxial structure, reducing the probability of nonradiative recombination of the carriers and the electrons, and optimizing the materials of various layers to reduce the influence of stress generated by mismatching of lattice constants of various layers on the internal light output power.

What is claimed is:

1. A light-emitting diode, comprising:

a substrate, and a buffer layer, an N-type gallium nitride layer, a light-emitting region buffer layer, a first light-emitting layer, a second light-emitting layer, an electron blocking layer, and a P-type gallium nitride layer that are epitaxially grown on the substrate in sequence, wherein the second light-emitting layer comprises one or more light-emitting well-barrier pair sub-layers;

a thickness of the light-emitting region buffer layer is a pre-set first multiple of a thickness of the light-emitting well-barrier pair sub-layer;

a thickness of the first light-emitting layer is a pre-set second multiple of the thickness of the light-emitting well-barrier pair sub-layer, wherein the second multiple is less than the first multiple; and a thickness of the electron blocking layer is a pre-set third multiple of the thickness of the light-emitting well-barrier pair sub-layer, wherein the third multiple is less than the first multiple, wherein the light-emitting region buffer layer, the first light-emitting layer, and the second light-emitting layer are all n-type doped nitride semiconductors containing Al, and wherein an average concentration of Al atoms in the second light-emitting layer is greater than an average concentration of Al atoms in the first light-emitting layer, and the average concentration of Al atoms in the first light-emitting layer is greater than an average concentration of Al atoms in the light-emitting region buffer layer.

2. The light-emitting diode according to claim 1, wherein the thickness of the light-emitting well-barrier pair sub-layer is 90 Å-160 Å, the first multiple is 20-40, the second multiple is 2.5-8, and the third multiple is 1-6.

3. The light-emitting diode according to claim 1, wherein the thickness of the light-emitting well-barrier pair sub-layer is 110 Å-160 Å, the first multiple is 25-40, the second multiple is 2.5-6, and the third multiple is 2-6.

4. The light-emitting diode according to claim 2, wherein the thickness of the light-emitting region buffer layer is 2000 Å-6000 Å, the thickness of the first light-emitting layer is 500 Å-700 Å, and the thickness of the electron blocking layer is 90 Å-960 Å.

5. The light-emitting diode according to claim 2, wherein the thickness of the light-emitting region buffer layer is 2500 Å-6000 Å, the thickness of the first light-emitting layer is 500 Å-700 Å, and the thickness of the electron blocking layer is 110 Å-960 Å.

6. The light-emitting diode according to claim 1, wherein the light-emitting region buffer layer, the first light-emitting layer, and the second light-emitting layer are all n-type doped nitride semiconductors containing In, wherein an average concentration of In atoms in the second light-emitting layer is greater than an average concentration of In atoms in the first light-emitting layer, and the average concentration of In atoms in the first light-emitting layer is greater than an average concentration of In atoms in the light-emitting region buffer layer.

7. The light-emitting diode according to claim 6, wherein an average concentration of n-type impurity atoms in the light-emitting region buffer layer is greater than an average concentration of n-type impurity atoms in the second light-emitting layer, and the average concentration of n-type impurity atoms in the second light-emitting layer is greater than or equal to an average concentration of n-type impurity atoms in the first light-emitting layer.

8. The light-emitting diode according to claim 6, wherein the light-emitting region buffer layer comprises one or more sub-layer pairs epitaxially grown in sequence, and wherein an In content in a sub-layer pair is less than the In content in the next sub-layer pair in the light-emitting region buffer layer.

9. The light-emitting diode according to claim 1, wherein the second light-emitting layer comprises: a first light-emitting well-barrier pair sub-layer and a second light-emitting well-barrier pair sub-layer, wherein the first light-emitting well-barrier pair sub-layer comprises: a first light-emitting well sub-layer and a first light-emitting barrier sub-layer; and the second light-emitting well-barrier pair sub-layer comprises: a second light-emitting well sub-layer and a second light-emitting barrier sub-layer, and wherein the first light-emitting well sub-layer is epitaxially grown on the first light-emitting layer, the first light-emitting barrier sub-layer is epitaxially grown on the first light-emitting well sub-layer, the second light-emitting well sub-layer is epitaxially grown on the first light-emitting barrier sub-layer, and the second light-emitting barrier sub-layer is epitaxially grown on the second light-emitting well sub-layer.

10. A semiconductor device, comprising a substrate, and a buffer layer, an N-type gallium nitride layer, a light-emitting region buffer layer, a first light-emitting layer, a second light-emitting layer, an electron blocking layer, and a P-type gallium nitride layer that are epitaxially grown on the substrate in sequence, wherein the second light-emitting layer comprises one or more light-emitting well-barrier pair sub-layers;

a thickness of the light-emitting region buffer layer is a pre-set first multiple of a thickness of the light-emitting well-barrier pair sub-layer;

a thickness of the first light-emitting layer is a pre-set second multiple of the thickness of the light-emitting well-barrier pair sub-layer, wherein the second multiple is less than the first multiple; and a thickness of the electron blocking layer is a pre-set third multiple of the thickness of the light-emitting well-barrier pair sub-layer, wherein the third multiple is less than the first multiple; and wherein the semiconductor device further comprises:

P electrode, disposed on and electrically connected to the P-type gallium nitride layer, and, N electrode, disposed on and electrically connected to the N-type gallium nitride layer, wherein the light-emitting region buffer layer, the first light-emitting layer, and the second light-emitting layer are all n-type doped nitride semiconductors containing Al and In, and wherein an average concentration of Al atoms in the second light-emitting layer is greater than an average concentration of Al atoms in the first light-emitting layer, and the average concentration of Al atoms in the first light-emitting layer is greater than an average concentration of Al atoms in the light-emitting region buffer layer.

11. The semiconductor device according to claim 10, wherein the thickness of the light-emitting well-barrier pair sub-layer is 90 Å-160 Å, the first multiple is 20-40, the second multiple is 2.5-8, and the third multiple is 1-6.

12. The semiconductor device according to claim 10, wherein the thickness of the light-emitting region buffer layer is 2000 Å-6000 Å, the thickness of the first light-emitting layer is 500 Å-700 Å, and the thickness of the electron blocking layer is 90 Å-960 Å.

13. The semiconductor device according to claim 11, wherein the thickness of the light-emitting well-barrier pair sub-layer is 110 Å-160 Å, the second multiple is 3-8.

14. The semiconductor device according to claim 11, wherein the light-emitting region buffer layer, the first light-emitting layer, and the second light-emitting layer are all n-type doped nitride semiconductors containing In, wherein an average concentration of In atoms in the second light-emitting layer is greater than an average concentration of In atoms in the first light-emitting layer, and the average concentration of In atoms in the first light-emitting layer is greater than an average concentration of In atoms in the light-emitting region buffer layer.

15. The semiconductor device according to claim 11, wherein an average concentration of n-type impurity atoms in the light-emitting region buffer layer is greater than an average concentration of n-type impurity atoms in the second light-emitting layer, and the average concentration of n-type impurity atoms in the second light-emitting layer is greater than or equal to an average concentration of n-type impurity atoms in the first light-emitting layer.

16. The semiconductor device according to claim 10, wherein the second light-emitting layer comprises: a first light-emitting well-barrier pair sub-layer and a second light-emitting well-barrier pair sub-layer, wherein the first light-emitting well-barrier pair sub-layer comprises: a first light-emitting well sub-layer and a first light-emitting barrier sub-layer; and the second light-emitting well-barrier pair sub-layer comprises: a second light-emitting well sub-layer and a second light-emitting barrier sub-layer, and wherein the first light-emitting well sub-layer is epitaxially grown on the first light-emitting layer, the first light-emitting barrier sub-layer is epitaxially grown on the first light-emitting well sub-layer, the second light-emitting well sub-layer is epitaxially grown on the first light-emitting barrier sub-layer, and the second light-emitting barrier sub-layer is epitaxially grown on the second light-emitting well sub-layer.

17. The semiconductor device according to claim 10, wherein a reflective layer is generally provided on a back side of the substrate, and the reflective layer is a Distributed Bragg Reflector layer or a metal reflective layer with a reflectivity equivalent to that of the Distributed Bragg Reflector layer.

* * * * *